United States Patent
Fuchida

(10) Patent No.: US 12,107,391 B2
(45) Date of Patent: Oct. 1, 2024

(54) SEMICONDUCTOR OPTICAL ELEMENT

(71) Applicant: Mitsubishi Electric Corporation, Tokyo (JP)

(72) Inventor: Ayumi Fuchida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 561 days.

(21) Appl. No.: 17/600,491

(22) PCT Filed: Apr. 27, 2020

(86) PCT No.: PCT/JP2020/017985
§ 371 (c)(1),
(2) Date: Sep. 30, 2021

(87) PCT Pub. No.: WO2020/255565
PCT Pub. Date: Dec. 24, 2020

(65) Prior Publication Data
US 2022/0173573 A1   Jun. 2, 2022

(30) Foreign Application Priority Data

Jun. 19, 2019   (WO) .................. PCT/JP2019/024206

(51) Int. Cl.
*H01S 5/10* (2021.01)
*H01S 5/22* (2006.01)

(52) U.S. Cl.
CPC .......... *H01S 5/1014* (2013.01); *H01S 5/1064* (2013.01); *H01S 5/22* (2013.01)

(58) Field of Classification Search
CPC .............................. H01S 5/1014; H01S 5/1064
See application file for complete search history.

(56) References Cited

U.S. PATENT DOCUMENTS 6,259,718 B1   7/2001   Okuda
2002/0141682 A1*  10/2002   Ryu ..................... G02B 6/1228
385/14

(Continued)

FOREIGN PATENT DOCUMENTS

JP   H09-129964 A   5/1997
JP   H10-098231 A   4/1998

(Continued)

OTHER PUBLICATIONS

An Office Action; mailed by the State Intellectual Property Office of the People's Republic of China on Jun. 17, 2023, which corresponds to Chinese Patent Application No. 202080043299.2 and is related to U.S. Appl. No. 17/600,491.

(Continued)

*Primary Examiner* — Tuan N Nguyen
(74) *Attorney, Agent, or Firm* — Studebaker & Brackett PC

(57) ABSTRACT

A semiconductor optical element has a mesa structure in which an active layer is embedded, and comprises a straight propagating section and a spot size converter section being such that a light confinement in the active layer is weaker than that of the straight propagating section, wherein in a same plane parallel to a layer surface of the active layer, an average value of a width of the mesa structure of the straight propagating section is smaller than a value of the width of the mesa structure at the emission facet of the spot size converter section, and at a top part of the mesa structure, an electrode is formed so that an electric current is injected in the active layer across the entire length of the straight propagating section and the spot size converter section.

16 Claims, 13 Drawing Sheets

(56) References Cited

U.S. PATENT DOCUMENTS

2002/0172248 A1* 11/2002 Kito .................. H01S 5/227
372/46.01
2013/0136391 A1   5/2013 Takiguchi
2017/0047710 A1   2/2017 Oh et al.

FOREIGN PATENT DOCUMENTS

| JP | H11-163456 A | 6/1999 |
| JP | 2000-036638 A | 2/2000 |
| JP | 2002-026449 A | 1/2002 |
| JP | 2013-115161 A | 6/2013 |

OTHER PUBLICATIONS

An Office Action issued by Taiwanese Patent Office on Dec. 18, 2020, which corresponds to Taiwanese Patent Application No. 109119864; with English language translation.
An Office Action; "Notice of Reasons for Refusal," mailed by the Japanese Patent Office on Jan. 12, 2021, which corresponds to Japanese Patent Application No. 2020-544546; with English language translation.
International Search Report issued in PCT/JP2020/017985; mailed Jun. 30, 2020.
An Office Action mailed by China National Intellectual Property Administration on Nov. 18, 2023, which corresponds to Chinese Patent Application No. 202080043299.2 and is related to U.S. Appl. No. 17/600,491; with English language translation.
An Office Action mailed by China National Intellectual Property Administration on Sep. 9, 2023, which corresponds to Chinese Patent Application No. 202080043299.2 and is related to U.S. Appl. No. 17/600,491.

* cited by examiner

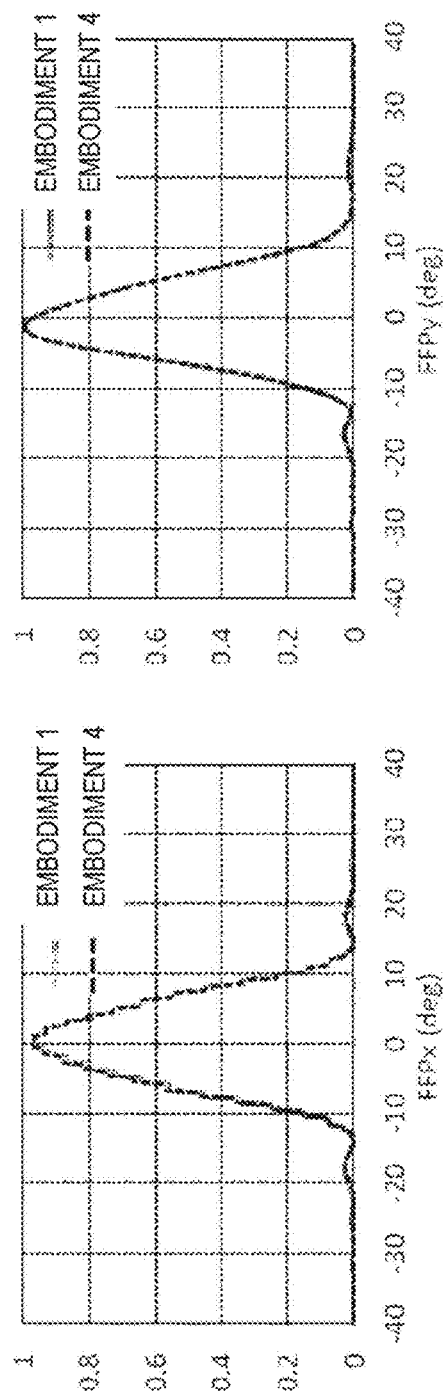

SEMICONDUCTOR OPTICAL ELEMENT

TECHNICAL FIELD

This application relates to a semiconductor optical element.

BACKGROUND ART

Regarding an embedded type semiconductor laser in which an active layer is embedded in a semiconductor layer, a structure, in which a taper waveguide which has an active layer whose width is narrowed gradually toward an emission facet side so as to integrate a spot size converter section in addition to a straight propagating section of a laser, is well known (for example, Patent Document 1).

In an active layer, electrons and holes which are injected from electrodes which are provided on a semiconductor layer and under the semiconductor layer, individually, are recombined and emission and gain can be obtained. A light which is generated in an active layer propagates in a straight propagating section and a spot size converter section and is amplified while obtaining gain. A light which is amplified propagates in a resonator which comprises facet mirrors being cleavage planes which are provided at front and rear of a semiconductor laser, and the light is reflected at the facet mirrors repeatedly. When the total of propagation loss and mirror loss is equal to gain which is obtained while propagating in an active layer, a laser is oscillated and a laser light is emitted from an emission facet. On this occasion, in a spot size converter section, the width of an active layer is narrowed gradually toward an emission facet, as a result, light confinement in an active layer is gradually weakened, and a penetration of light in a semiconductor layer in which an active layer is embedded becomes greater. Consequently, a spot size at an emission facet can be enlarged. When a spot size of Near Field Pattern (NFP) in the vicinity of an emission facet is large, diffraction of an emitted light becomes small, therefore the width of a beam in Far Field Pattern (FFP) can be narrowed in comparison with a case in which a spot size converter is not integrated. It is easy for a light whose beam width is narrow to be aligned with regard to a fiber. There is a benefit such that eclipse of light against fiber can be suppressed and as a result, excellent bonding efficiency can be obtained.

According to Patent Document 2, regarding an embedded type semiconductor laser containing a butt joint structure comprising an active layer and an optical waveguide, a structure, that is, the width of a mesa structure in which a waveguide part is embedded is made narrower than the width of a mesa structure in which an active layer is embedded, is suggested. According to the above mentioned structure, propagation of scattered light, which is generated in a butt joint structure, in a mesa in which a waveguide is embedded can be suppressed, therefore a mode disturbance can be improved.

PRIOR ART DOCUMENT

Patent Document

Patent Document 1 JP 2000-36638A
Patent Document 2 JP 2013-115161A

SUMMARY OF THE INVENTION

Problems to be Solved by the Invention

Conventional embedded type semiconductor laser in which a spot size converter is integrated is configured by the above mentioned configuration, the width of a mesa structure, in which an active layer is embedded, is wide so as to enlarge a spot size efficiently at an emission facet. However, when the width of a mesa structure in which an active layer is embedded is enlarged, an electrode area, which is provided in a mesa so as to inject an electric current to the active layer, is increased, consequently, parasitic capacitance is increased. An element which has large parasitic capacitance cannot follow high speed electric signal, therefore an optical output signal waveform of an emitted light will be deformed. Consequently, a method in which a spot size converter is formed by using an active layer which is same as that of a laser and is integrated in a laser is used widely for an high output laser which does not need light intensity modulation or a laser which is modulated at comparatively low speed lower than 1.5 Gbps, however, there is a problem such that the above mentioned method is not appropriate for high speed modulation use.

Even in a case where a spot size converter is integrated in a laser for high speed modulation use (for example, electro-absorption modulator integrated laser), in many cases, a spot size converter section is formed using a semiconductor wave guide which is different from an active layer which constitutes a laser section. In this case, it is not necessary to inject an electric current to a spot size converter section, therefore, it is not necessary to form an electrode in a mesa. Consequently, the mesa width can be enlarged without considering parasitic capacitance, therefore, it is possible to realize high speed modulation and narrow width of an emitted beam at the same time. However, there is a disadvantage such that disturbance of wave guide mode is generated and emitted beam shape is deformed due to increase of the number of crystal growth for a spot size converter section and mismatch of shape or refractive index in connecting part of a laser section and a spot size converter section.

This application discloses the technology to solve the above mentioned problems and aims to provide a semiconductor optical element which comprises a spot size converter section which has small parasitic capacitance and which can make high speed modulation

Means for Solving Problems

A semiconductor optical element which is disclosed by this application has a mesa structure in which an active layer is embedded, and the semiconductor optical element comprises a straight propagating section in which a width of the active layer is uniform and a spot size converter section positioned further toward a light emission side than the straight propagating section and being such that a light confinement in the active layer is weaker than that in the straight propagating section and a spot size of a light at an emission facet is greater than a spot size of a light of the straight propagating section, in a same plane parallel to a layer surface of the active layer, an average value of a width of the mesa structure of the straight propagating section is smaller than a value of a width of the mesa structure at the emission facet of the spot size converter section.

Effects of Invention

According to a semiconductor optical element which is disclosed by this application, a semiconductor optical element, which comprises a spot size converter whose parasitic capacitance is small and which can perform high speed modulation, can be obtained.

BRIEF DESCRIPTION OF DRAWINGS

FIG. 20A and FIG. 20B are figures showing an example of FFP characteristic of a semiconductor optical element according to Embodiment 4 and that of Embodiment 1.

MODE FOR CARRYING OUT THE INVENTION

Embodiment 1

Figure 1:
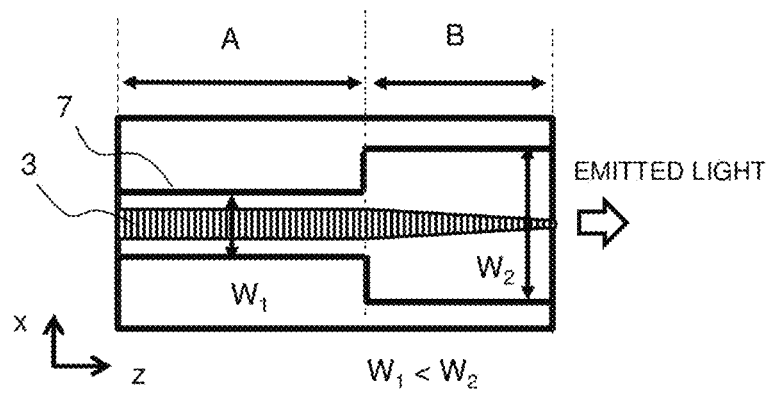
FIG. 1 is a schematic cross section showing a structure of a semiconductor optical element in a surface containing an active layer according to Embodiment 1.
Figure 2:
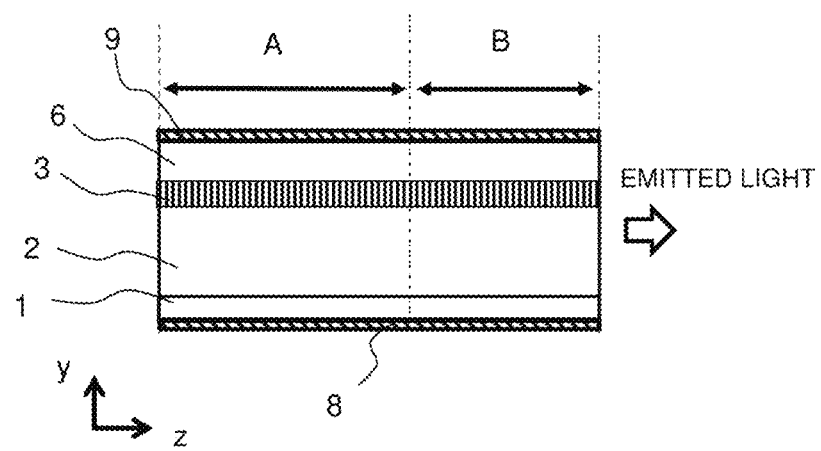
FIG. 2 is a schematic cross section showing a structure of a semiconductor optical element which is parallel to an optical axis and is perpendicular to a surface of an active layer according to Embodiment 1.
Figure 3A:
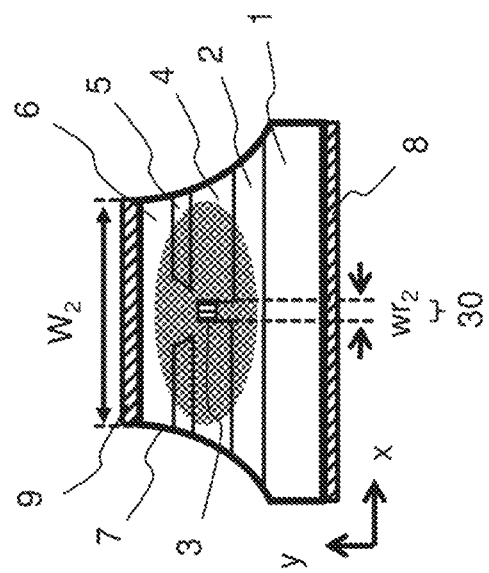
FIG. 3A is a schematic cross section showing a structure of a straight propagating section of a semiconductor optical element which is perpendicular to an optical axis according to Embodiment 1.
Figure 3B:
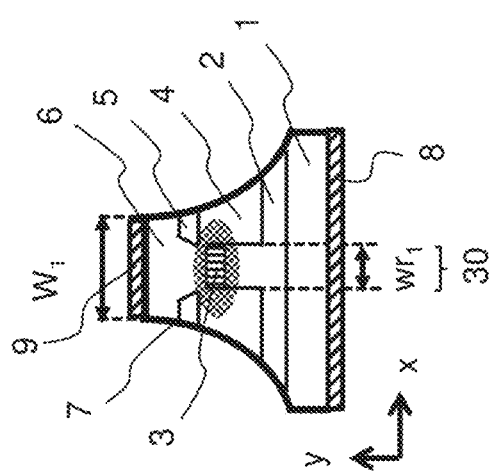
FIG. 3B is a schematic cross section showing a structure of a spot size converter section of a semiconductor optical element which is perpendicular to an optical axis according to Embodiment 1.

FIG. 1 is a schematic xz cross section, in a surface containing an active layer, showing a structure of a semiconductor laser which is a semiconductor optical element according to Embodiment 1. Further, FIG. 2 is a yz cross section. Here, a horizontal direction which crosses perpendicularly with regard to an optical axis of a resonator of a semiconductor laser is indicated with x, a stacking direction of semiconductor layers is indicated with y and a propagation direction of light is indicated with z. A semiconductor laser comprises a straight propagating section A at a side of rear facet and a spot size converter section B at a side of front facet which is an emission side of light. In many cases, the entire length of a semiconductor laser comprising the straight propagating section A and the spot size converter section B is in a range of 150 um to 400 um, however, the entire length is not limited to the above mentioned range. FIG. 3A is an xy cross section of the straight propagating section A, that is a schematic cross section which is perpendicular to an optical axis and FIG. 3B is an xy cross section of the spot size converter section B, that is a schematic cross section which is perpendicular to an optical axis.

A semiconductor optical element according to Embodiment 1 will be manufactured as follows, for example. First, in an n type InP substrate 1 having (001) plane as a principal plane and having carrier concentration $4\times10^{18}/cm^3$ in which Si is doped, an n type InP cladding layer 2 having carrier concentration $4\times10^{18}/cm^3$ and a thickness of 0.5 um, and an active layer 3 which is made of an AlGaInAs-based or an InGaAsP-based semiconductor material having a thickness of 0.2 um are grown by using a semiconductor film forming machine such as MOCVD or MBE. Here, an n type InP substrate is described as an example, however, a p type InP substrate or a Fe doped InP substrate may be used. Further, it is not limited to InP-based, but a semiconductor material such as GaAs-based or GaN-based may be used. Regarding an active layer, a multiquantum well structure may be contained.

Next, after a stripe shaped mask which extends in a z direction is formed using an insulation film such as $SiO_2$, etching is performed so as to reach a depth of an n type InP substrate 1 or an n type InP cladding layer 2 and a ridge structure 30 containing an active layer 3 is formed. At this time, regarding the width of the ridge structure 30 containing the active layer 3 in the straight propagating section A, that is, active layer width $wr_1$ and active layer width $wr_2$ of the spot size converter section B, relationship $wr_1 > wr_2$ exists. The active layer width $wr_1$ in the straight propagating section A is uniform, in many cases, the active layer width $wr_1$ is in a range between 0.8 to 1.6 um, however, when single mode condition is satisfied, the active layer width $wr_1$ is not limited to the above mentioned range. When the active layer width $wr_2$ at an emission facet of light in the spot size converter section B satisfies the relationship $wr_1 > wr_2$, a tapered structure whose width is narrowed gradually toward the emission facet may be contained.

Next, in the order of a p type InP embedded layer 4 in which Zn is doped and which has carrier concentration of $5 \times 10^{17}/cm^3$ and an n type InP block layer 5 which has carrier concentration of $1 \times 10^{19}/cm^3$, outside of a ridge is embedded. Regarding an embedded layer, a semi-insulating material such as InP in which Ru or Fe is doped may be used. Further, an embedded layer, in which a plurality of semiconductor stacking layers having a different carrier concentration or a different polarity are combined, may be used.

Figure 4:
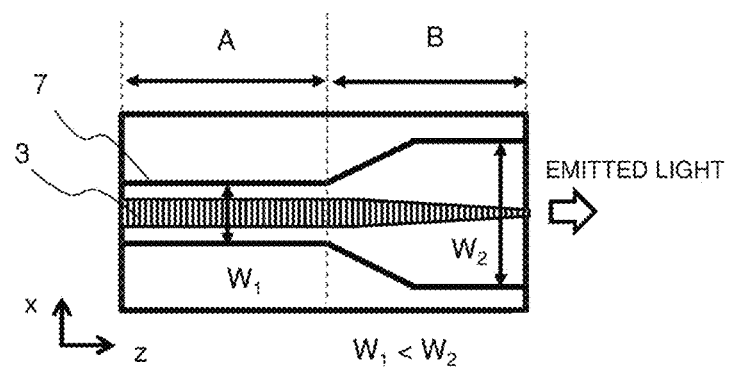
FIG. 4 is a schematic cross section showing another structure of a semiconductor optical element in a surface containing an active layer according to Embodiment 1.
Figure 5:
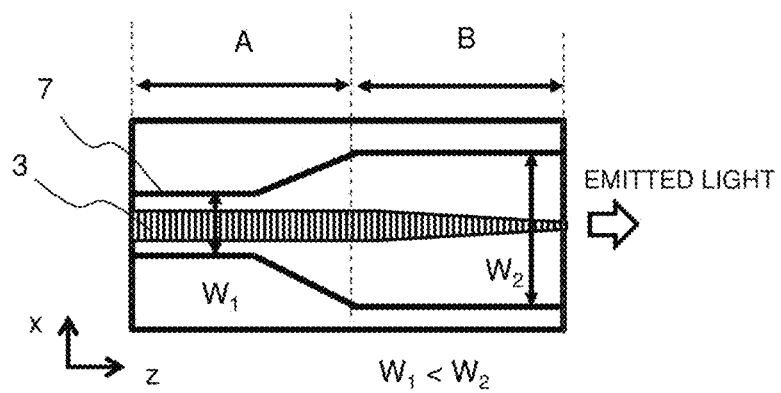
FIG. 5 is a schematic cross section showing another structure of a semiconductor optical element in a surface containing an active layer according to Embodiment 1.

Next, on an n type InP block layer 5 and the active layer 3 of the ridge structure 30, a p type cladding layer 6 which has carrier concentration of $1 \times 10^{19}/cm^3$ is formed, etching is performed so as to reach the n type InP substrate 1 or the n type InP cladding layer 2, and a mesa structure 7 in which the active layer 3 is embedded inside is formed. At this time, regarding a width of the mesa structure in the straight propagating section A, that is, a mesa width $W_1$ and a mesa width $W_2$ of the spot size converter section B, relationship $W_1 < W_2$) exists. As shown in FIG. 1, $W_1$ and $W_2$ may be uniform width in the straight propagating section A and the spot size converter section B, individually, further as shown in FIG. 4, in the spot size converter section B, or as shown in FIG. 5, in the straight propagating section A, a tapered structure in which the mesa width enlarges gradually toward an emission facet may be contained. When an average value of the mesa width in the straight propagating section A is smaller than a value of the mesa width at an emission facet of the spot size converter section B, any mesa width is acceptable. Further, the mesa width is different depending on a position in a y direction, however, in the same xz plane, for example, in the same plane which is parallel to the layer surface of the active layer 3, the mesa width satisfies the above mentioned relationship.

Further, in a rear surface of an n type InP substrate 1, an n electrode 8 is formed, and in a front surface of a p type cladding layer 6, a p electrode 9 is formed, individually. As shown in FIG. 2, FIG. 3A and FIG. 3B, along the entire length of the straight propagating section A and the spot size converter section B, the p electrode 9 having the mesa width is formed at a top part of the mesa structure 7. Consequently, regarding a semiconductor laser according to this application, an electric current is injected not only to the straight propagating section A but also to the entire length of the spot size converter section B, as a result, gain is obtained also in the spot size converter section B, and high output of laser output can be realized. When an electric current is not injected to the active layer 3 in the spot size converter section B, in the active layer 3, light is lost, however, in the case of the above mentioned structure, gain is obtained. The n electrode 8 and the p electrode 9 are composed of metal containing Au, Pt, Zn, Ge, Ni, Ti, etc. or metal combining thereof. In general, a semiconductor laser has a capacitance structure in which semiconductor stacking layers are sandwiched between the n electrode 8 and the p electrode 9, therefore parasitic capacitance exists.

A semiconductor optical element according to Embodiment will function as follows. First, when an electric current is injected between the p electrode 9 and the n electrode 8, holes which are provided by the p type cladding layer 6 are constricted by the n type InP block layer 5, as a result, holes are effectively injected to the active layer 3. In the same way, electrons are supplied from the n type InP substrate 1 and the n type InP cladding layer 2, and are injected to the active layer 3. When electrons and holes which are injected in the active layer 3 are recombined, light emission and gain can be obtained. In general, refractive index of the active layer 3 is higher than those of the embedded layer and the block layer which surround the active layer, therefore light emission which is generated by recombination is confined in the active layer 3. A rear facet mirror in the straight propagating section A and a front facet mirror which is at an emission side of light in the spot size converter section B constitute a Fabry-Perot resonator and light emission which is generated in the active layer 3 propagates in the resonator while obtaining gain so as to resonate. That is, the straight propagating section A and the spot size converter section B are contained in the resonator, and as above mentioned, an electric current is injected also in the active layer 3 in the spot size converter section B so as to obtain gain. When the total of propagation loss of light and mirror loss equals to light gain, a laser will be oscillated, and laser light will be emitted from a facet. At this time, in the straight propagating section A, the ridge width $wr_1$ is large, therefore light is confined strongly in the active layer 3. On the other hand, in the spot size converter section B, the ridge width $wr_2$ is narrow, therefore, light confinement is weak, and amount of light which is leaked outside of the active layer 3 is large, as a result, a spot size becomes large. As above mentioned, in the spot size converter section B, a spot size of light at an emission facet of light becomes larger than a spot size of light in the straight propagating section A, consequently, a spot size will be converted. When a spot size of NFP at an emission facet is large, diffraction of light becomes small, therefore, an FFP beam width of an emitted light will be narrowed.

Figure 6:
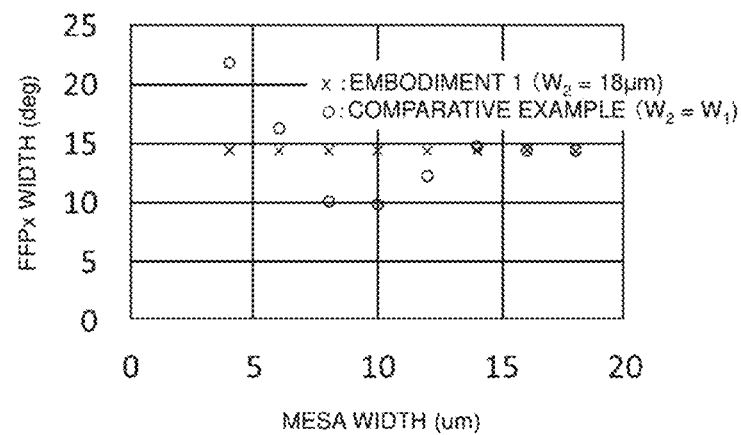
FIG. 6 is a figure showing FFP characteristics in an x direction of a semiconductor optical element according to Embodiment 1 and that according to a comparative example.
Figure 7:
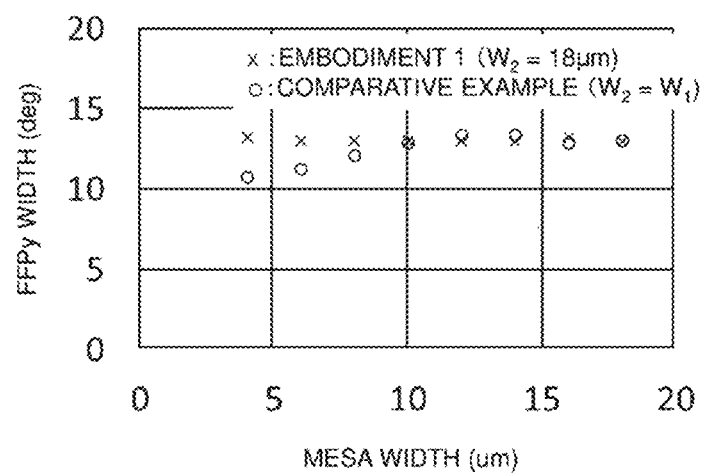
FIG. 7 is a figure showing FFP characteristics in a y direction of a semiconductor optical element according to Embodiment 1 and that according to a comparative example.

Regarding the relationship of the mesa width and an FFP width of an emitted beam in an x direction and that in a y direction, result which is obtained by simulating with beam propagation method (BPM) will be shown in FIG. 6 and FIG. 7. Regarding a semiconductor laser according to Embodiment 1 in which the mesa width $W_2$ of the spot size converter section is fixed to 18 μm and a semiconductor laser according to comparative example in which $W_2$ is made to be same as the mesa width $W_1$ in the straight propagating section, the mesa width $W_1$ in the straight propagating section is changed and simulated, and the result is shown in FIG. 6 and FIG. 7. At this time, it is assumed such that oscillation wavelength is 1270 nm, refractive index of an active layer 3 is 3.355, refractive index of an InP layer is 3.207, the ridge width $wr_1$ is 1.5 um and $wr_2$ is 0.6 um. Regarding a semiconductor laser according to Embodiment 1, when a length which is used for simulation as the straight propagating section A is set to be 10 um, a length of a spot size converter section B is set to be 90 um, a ridge structure 30 of a spot size converter section B which contacts with the straight propagating section A is made to be a structure containing a tapered structure having a length of 25 um.

Together with FFPx which is FFP full width at half maximum in an x direction, that is, a horizontal direction shown in FIG. 6 and FFPy which is FFP full width at half maximum in a y direction, that is, a perpendicular direction shown in FIG. 7, regarding FFP full width at half maximum according to Embodiment 1, the FFP width is uniform regardless of the mesa width $W_1$, however, in a comparative example, when the mesa value $W_1$ is made to be narrower than 14 um, the FFP width begins to change. Especially, in a range of $W_1 \leq 6$ um, when the mesa width is narrower, FFP full width at half maximum FFPx in a horizontal direction enlarges, consequently, the spot size converter section B does not function.

Figure 8:
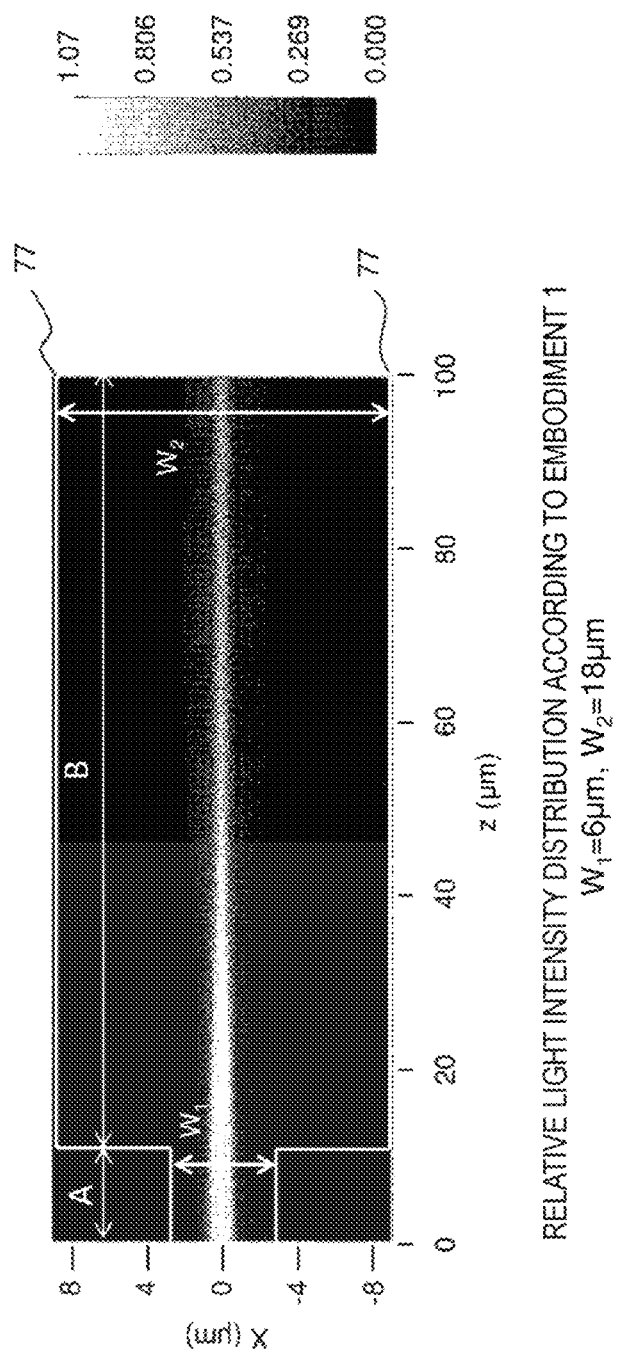
FIG. 8 is a figure showing an example of inner light intensity distribution of a semiconductor optical element according to Embodiment 1.
Figure 9:
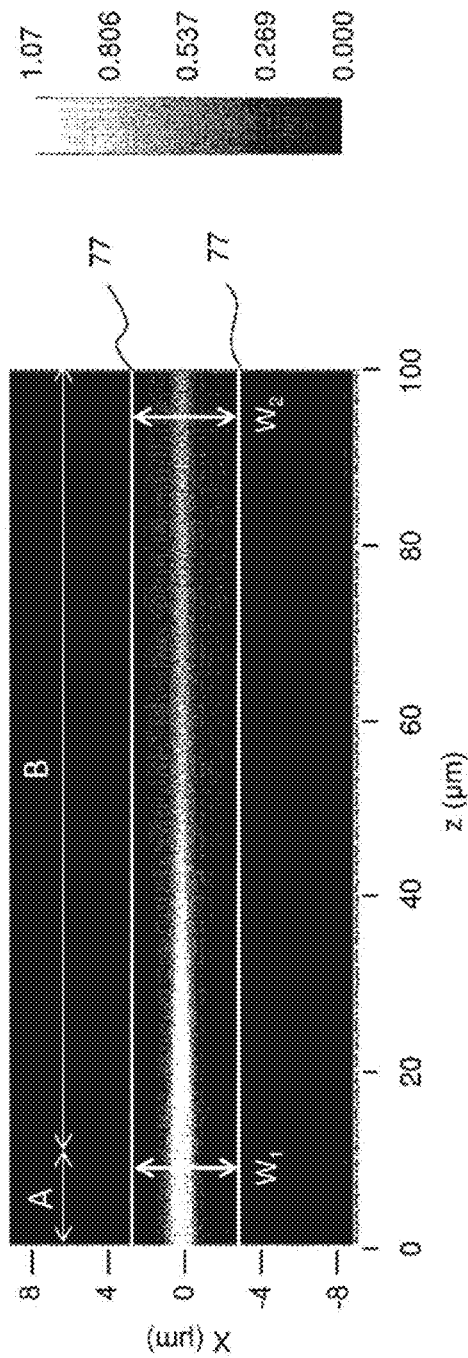
FIG. 9 is a figure showing an example of inner light intensity distribution of a semiconductor optical element according to a comparative example.

In order to describe the cause of the above mentioned, FIG. 8 shows the xy plan view of relative light intensity distribution according to Embodiment 1 and FIG. 9 shows the xy plan view of relative light intensity distribution according to comparative example. Further, in Embodiment 1 shown in FIG. 8, $W_1=6$ um, $W_2=18$ um and in a comparative example shown in FIG. 9, $W_1=W_2=6$ um. Further, in FIG. 8 and FIG. 9, border 77 in the mesa structure 7 is indicated with white line. In a comparative example shown in FIG. 9, in the spot, size converter section B. toward an emission facet, light extends in a horizon direction, on the other hand, the mesa width $W_2$ is narrow, therefore, in the vicinity of an emission facet, light cannot be sufficiently extended. Consequently, in a comparative example shown in FIG. 9, when the mesa width $W_1$ is narrowed shorter than 6 um, FFP full width at half maximum in a horizontal direction cannot be narrowed. Further, in the vicinity of z=50 um in a comparative example shown in FIG. 9, bottom of light distribution which is extended exists at interface between the mesa and air, therefore a mode disturbance is generated.

As shown in FIG. 6, in a range of $W_1=6$ to 14 um, the horizontal direction FFP width FFPx in a comparative example is narrower than that in Embodiment 1 due to a mode disturbance. Due to the above mentioned mode disturbance, for example, variations of an emitted beam width may be increased by variations of the mesa width $W_2$ which is generated in a wafer surface or an emitted beam shape is deformed so as to decrease coupling coefficient for an optical fiber, and consequently, the mode disturbance is not preferable. Regarding relative light intensity distribution according to Embodiment 1 shown in FIG. 8, the mesa width $W_2$ in the spot size converter section B is sufficiently large, therefore, regardless of the mesa width $W_1$ in a straight propagating section A, a spot size in an emission facet can be enlarged, and as a result, narrow FFP full width at half maximum can be obtained. Further, even if the mesa width $W_2$ in a spot size converter section B varies, when bottom of extended light distribution does not exist at interface between the mesa and air, variations of emitted beam width and the mode disturbance shown in FIG. 9 can be prevented.

Next, parasitic capacitance will be considered. A semiconductor laser has a structure in which semiconductor layers are sandwiched by the p electrode 9 which is formed in the mesa structure 7 and the n electrode 8 which is formed in a rear surface of the n type InP substrate 1. In general, capacitance C of a capacitor is expressed with formula (1). Here, ε indicates permittivity of a semiconductor layer and S indicates an area of an electrode and d indicates a distance between electrodes.

$$C = \varepsilon S/d \qquad (1).$$

Regarding a semiconductor laser having a conventional structure in which a mesa width is uniform, in order to narrow FFP full width at half maximum of an emitted beam, it is necessary to enlarge a mesa width along the entire length of the semiconductor laser. As a result, an electrode area S on the mesa is enlarged, capacitance C of a laser element, that is, parasitic capacitance is increased. In Embodiment 1, while the mesa width $W_2$ in a spot size converter section B which is required for obtaining narrow FFP full width at half maximum is maintained large, the mesa width $W_1$ in a straight propagating section A which is irrelevant to controlling FFP full width at half maximum is narrowed. As a result, in Embodiment 1, an electrode area S on the mesa is narrowed in comparison with that of conventional structure, therefore parasitic capacitance can be reduced.

As above mentioned effect, according to Embodiment 1, a semiconductor laser which can realize narrow width of FFP and reduction of parasitic capacitance at the same time can be obtained. The laser having above mentioned structure has the merit such that alignment for an optical fiber can be realized easily and modulation using high speed signal can be realized.

Embodiment 2

Figure 10:
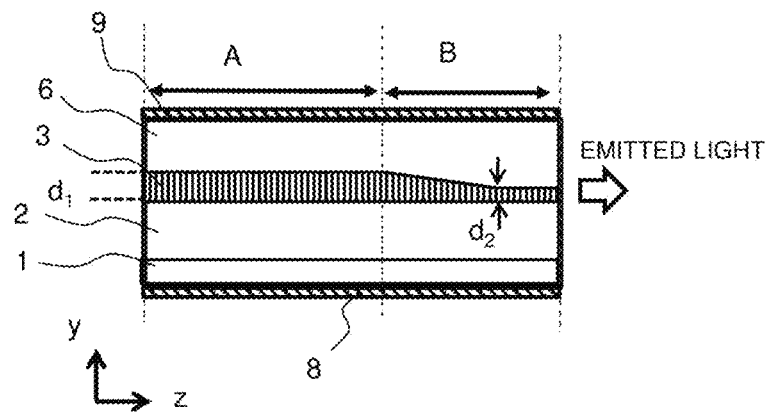
FIG. 10 is a schematic side cross section showing a structure of a semiconductor optical element which is parallel to an optical axis according to Embodiment 2.
Figure 11:
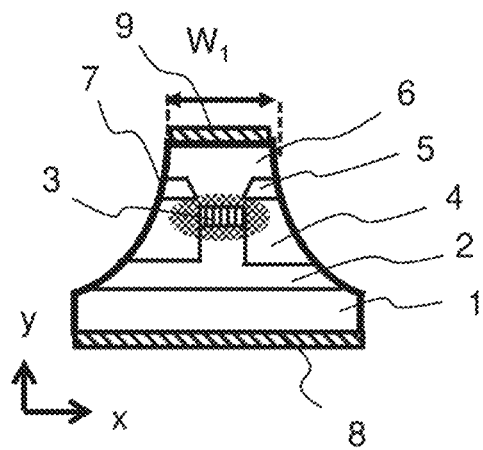
FIG. 11 is a schematic cross section showing a structure of a straight propagating section of a semiconductor optical element which is perpendicular to an optical axis according to Embodiment 2.
Figure 12:
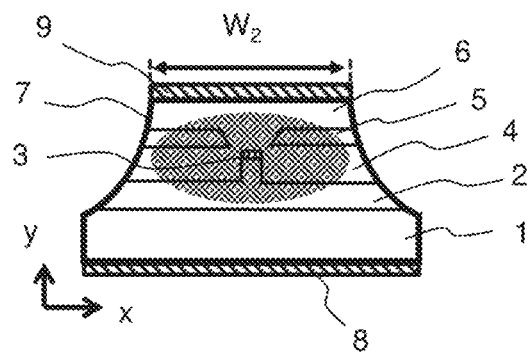
FIG. 12 is a schematic cross section showing a structure of a spot size converter section of a semiconductor optical element which is perpendicular to an optical axis according to Embodiment 2.

FIG. 10 is a schematic yz cross section showing a semiconductor laser as a semiconductor optical element according to Embodiment 2, that is, a side cross section which is parallel to an optical axis. FIG. 11 is a schematic xy cross section showing a straight propagating section A, and FIG. 12 is a schematic xy cross section showing a spot size converter section B. In Embodiment 2, a thickness $d_1$ of an active layer 3 in the straight propagating section A and a thickness $d_2$ of an active layer in the spot size converter section B are made to be different, that is, $d_1 > d_2$. As shown in FIG. 10, a tapered structure, in which a thickness $d_2$ of an active layer in the spot size converter section B becomes smaller gradually toward an emission facet, may be contained. A thickness of the active layer 3 in the straight propagating section A and that in the spot size converter section B may be same. A mesa width and structures of layers except for the above mentioned conditions are same as that of Embodiment 1.

Figure 13:
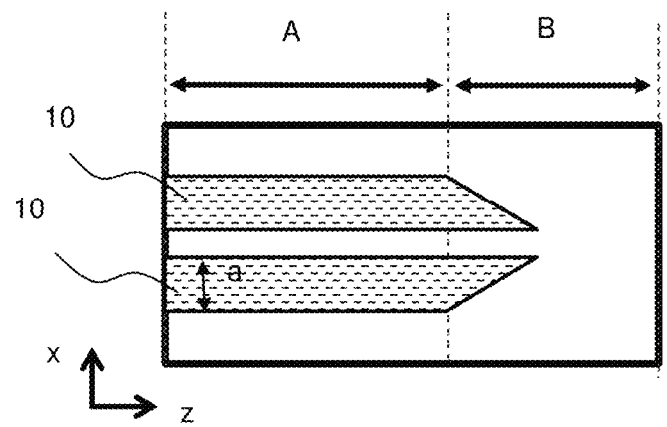
FIG. 13 is a top view showing a part of manufacturing process of a semiconductor optical element according to Embodiment 2.

A structure, in which a thickness of the active layer 3 is different in an optical axis direction as above mentioned, can be manufactured as follows, for example. After an n type InP cladding layer is grown on an n type InP substrate 1, as shown in a plan view of FIG. 13, a pair of masks whose width in the spot size converter section B is narrower than that in the straight propagating section A are formed using an insulating film such as $SiO_2$, after that, an active layer 3 is selectively grown. Consequently, regarding an active layer which is grown in a region which is sandwiched by a pair of masks, at a part where the width of the masks is large, between a pair of masks, large amount of material gas exists, therefore, a film thickness becomes large, on the other hand, at a part where the width of masks is narrow, a film thickness becomes small.

A semiconductor optical element according to Embodiment 2 will function as follows. In the straight propagating section A, in the vicinity of the active layer 3, light is strongly confined, however, in the spot size converter section B, a thickness of the active layer 3 is smaller than that of the straight propagating section A, therefore, light is confined more weakly in comparison with a case of the straight propagating section A, as a result, spot size is enlarged. In the same way as that of Embodiment 1, when the mesa width $W_1$ in the straight propagating section A is narrowed so as to satisfy the relationship $W_1 < W_2$ while the mesa width $W_2$ in the spot size converter section B is maintained large, parasitic capacitance can be decreased and at the same time, a spot size at an emission facet can be enlarged, as a result, an emitted beam in which a width of FFP is narrow can be obtained.

Embodiment 3

Figure 14:
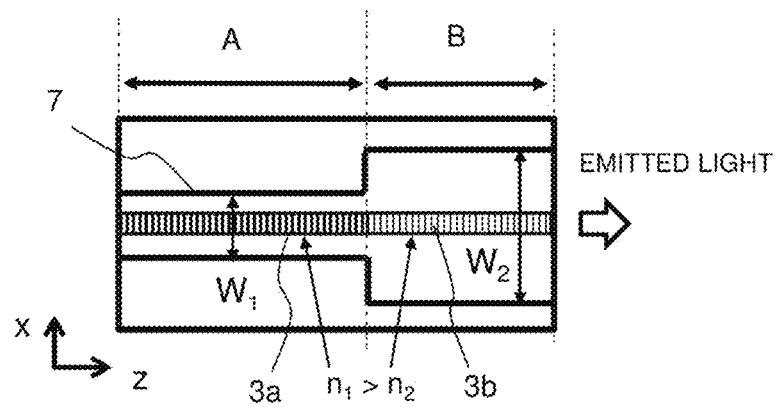
FIG. 14 is a schematic cross section showing a structure of a semiconductor optical element in a surface containing an active layer according to Embodiment 3.
Figure 15:
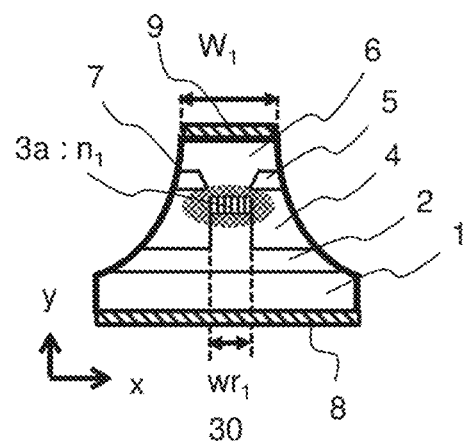
FIG. 15 is a schematic cross section showing a structure of a straight propagating section of a semiconductor optical element which is perpendicular to an optical axis according to Embodiment 3.
Figure 16:
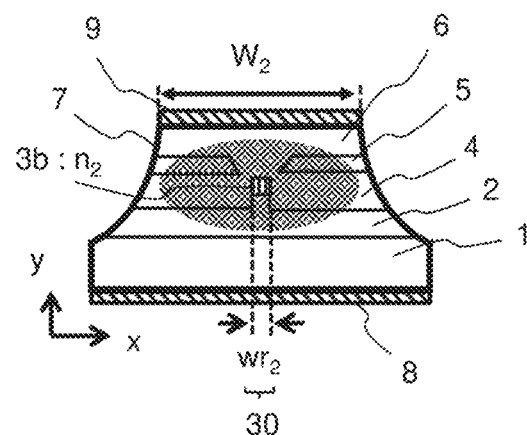
FIG. 16 is a schematic cross section showing a structure of a spot size converter section of a semiconductor optical element which is perpendicular to an optical axis according to Embodiment 3.

In FIG. 14, FIG. 15 and FIG. 16, a structure of a semiconductor laser as a semiconductor optical element according to Embodiment 3 will be shown. FIG. 14 is a schematic xz cross section in a surface containing an active layer, FIG. 15 is a schematic xy cross section of a straight propagating section A and FIG. 16 is a schematic xy cross section of a spot size converter section B. In Embodiment 3, regarding refractive index $n_1$ of an active layer 3a in the straight propagating section A and refractive index $n_2$ of an active layer 3b in the spot size converter section B, there is the relationship of $n_1>n_2$. The mesa width and structures of layers except for the above mentioned conditions are same as those of Embodiment 1. Refractive index $n_2$ in the spot size converter section B may have a graded structure in which refractive index is lowered gradually toward an emission facet.

A semiconductor optical element according to Embodiment 3 will function as follows. In the straight propagating section A, refractive index $n_1$ in the active layer 3a is high, therefore, light is confined strongly where the center of the light is in the active layer 3a. On the other hand, in the spot size converter section B, refractive index $n_2$ of the active layer 3b is lower than $n_1$ and the difference of refractive index between the active layer and an embedded layer is small than that in the straight propagating section A, therefore, light is confined weakly. Consequently, light is leaked outside of the active layer 3a, therefore, spot size is enlarged. Consequently, in order to narrow an emitted beam width, it is necessary to maintain the mesa width $W_2$ of the spot size converter section B wide so as for a spot size to be enlarged at an emission facet. On the other hand, the straight propagating section A is irrelevant to controlling of FFP full width at half maximum of an emitted beam, by narrowing the mesa width $W_1$ so as to satisfy the relationship of $W_1<W_2$, parasitic capacitance can be decreased. As a result, in the same way as that of Embodiment 1, an electrode area S in a mesa can be decreased in comparison with a conventional structure, parasitic capacitance can be decreased and also an emitted beam width can be narrowed.

Embodiment 4

Figure 17:
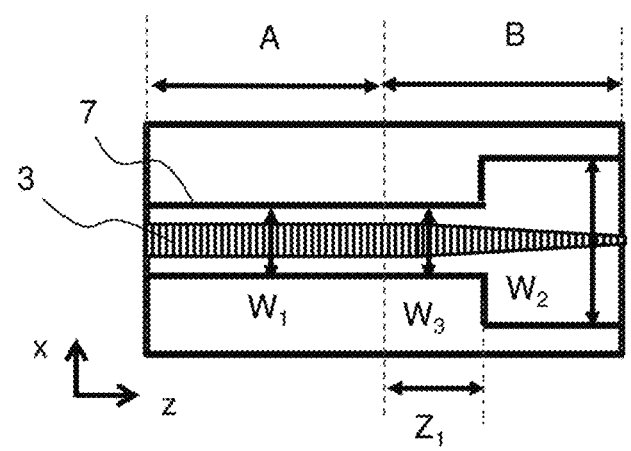
FIG. 17 is a schematic cross section showing a structure of a semiconductor optical element in a surface containing an active layer according to Embodiment 4.
Figure 18:
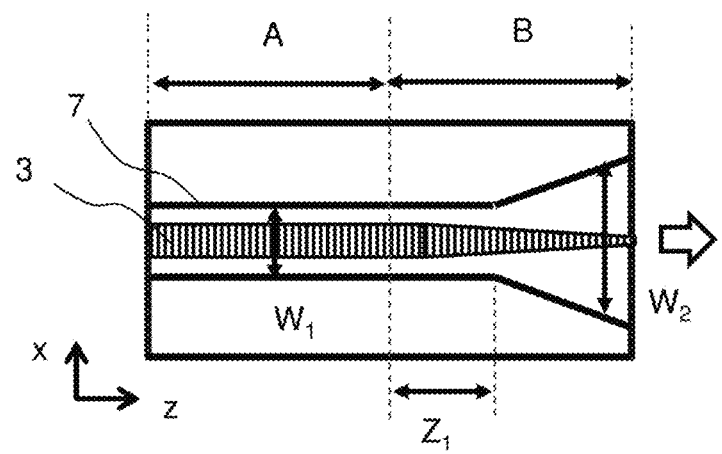
FIG. 18 is a schematic cross section showing another structure of a semiconductor optical element in a surface containing an active layer according to Embodiment 4.

FIG. 17 is a schematic cross section showing a semiconductor laser as a semiconductor optical element according to Embodiment 4 in a cross section of xz plane containing an active layer 3. In Embodiment 4, regarding a spot size converter section B, a mesa width $W_3$ in a region which is close to a straight propagating section A is narrower than a mesa width $W_2$ in the vicinity of an emission facet. Further, the mesa width $W_2$ is increased from a part which is $Z_1$ away to an emission facet side from a border between the straight propagating section A and the spot size converter section B, and relationship $W_1 \le W_3 \le W_2$ is satisfied. As shown in FIG. 17, the mesa width $W_2$ in the spot size converter section B may enlarge stepwise toward an emission facet, or as shown in FIG. 18, the mesa width $W_2$ may contain a tapered structure which gradually enlarges toward an emission facet.

Figure 19:
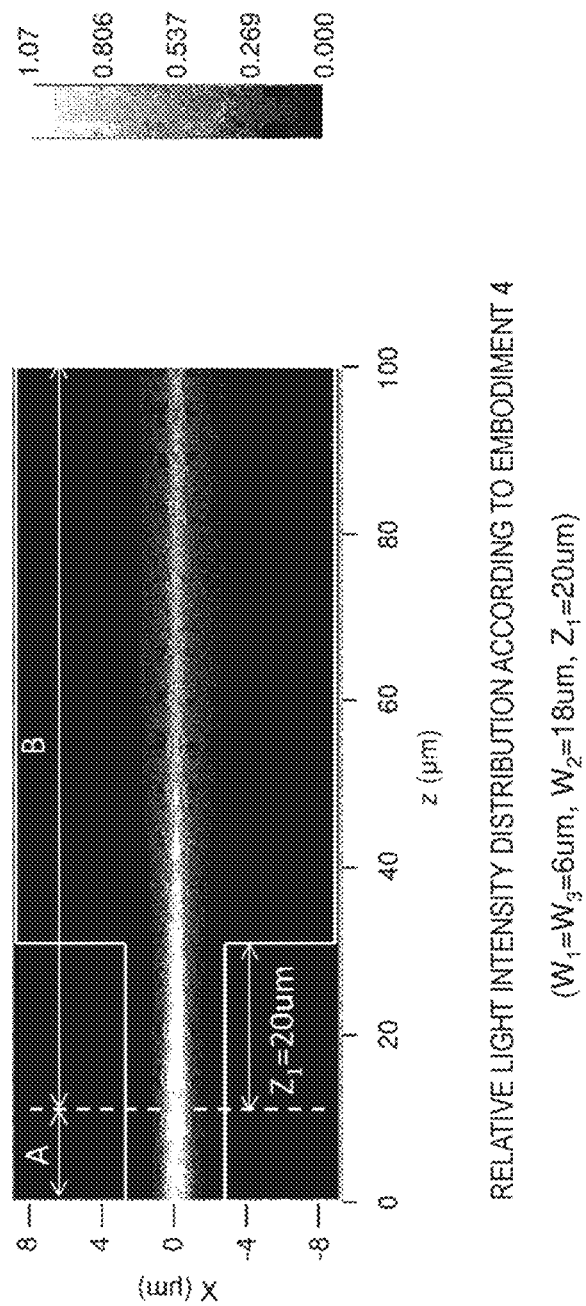
FIG. 19 is a figure showing an example of inner light intensity distribution of a semiconductor optical element according to Embodiment 4.

The semiconductor optical element according to Embodiment 4 will function as follows. In the spot size converter section B, in the vicinity of the border between the straight propagating section A, in comparison with an emission facet, a spot size is not enlarged efficiently. Consequently, in a range where bottom of light intensity distribution does not exist outside of the mesa, the mesa width $W_3$ in the vicinity of a border between the straight propagating section A can be narrowed. For example, when it is set such that $W_1=W_3=6$ um, $W_2=1.8$ um and $Z_1=20$ um, simulation will be performed using BPM. FIG. 19 shows light intensity distribution in an xz plane when the simulation is performed. When FIG. 19 is compared with FIG. 8 which shows Embodiment 1 ($W_1=6$ um, $W_2=18$ um), any difference of light intensity distribution is not found. Further, FIG. 20A shows horizontal direction FFP beam form FFPx of an emitted beam, FIG. 20B shows perpendicular direction FFP beam form FFPy when simulation is performed, together with form of Embodiment 1. In the above mentioned cases, there is not any difference between that of Embodiment 1, and it is found out such that an emitted beam having narrow FFP width is obtained.

As above mentioned, regarding a relationship of a width of a mesa structure in a straight propagating section A and that in a spot size converter section B, it is characterized such that in any embodiment, in the plane which is parallel to a layer surface of an active layer 3, an average value of the width of the mesa structure 7 in the straight propagating section A is smaller than the width of the mesa structure 7 at the emission facet of light in the spot size converter section B. Due to the above mentioned characteristic, a semiconductor optical element, which has a spot size converter section, and which has small parasitic capacitance and can realize high speed modulation, can be provided.

Although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF REFERENCE CHARACTERS

1: InP substrate
2: cladding layer
3, 3a, 3b: active layer
4: embedded layer
7: mesa structure
8: n electrode
9: p electrode
30: ridge structure
A: straight propagating section
B: spot size converter section

The invention claimed is:
1. A semiconductor optical element having a mesa structure in which an active layer is embedded,
wherein the semiconductor optical element comprises
a straight propagating section in which a width of the active layer is uniform and
a spot size converter section positioned further toward a light emission side than the straight propagating section and being such that a light confinement in the active layer is weaker than a light confinement in the straight propagating section and a spot size of a light at an emission facet is greater than a spot size of a light of the straight propagating section,
wherein in a same plane parallel to a layer surface of the active layer, an average value of a width of the mesa structure of the straight propagating section is smaller than a value of the width of the mesa structure at the emission facet of the spot size converter section, and at a top part of the mesa structure, an electrode is formed so that an electric current is injected in the active layer across over whole length of the straight propagating section and the spot size converter section.
2. The semiconductor optical element according to claim 1, wherein the width of the active layer at the emission facet in the spot size converter section is narrower than the width of the active layer in the straight propagating section.

3. The semiconductor optical element according to claim 2, wherein in the spot size converter section, the width of the mesa structure enlarges stepwise toward the emission facet.

4. The semiconductor optical element according to claim 2, wherein a part in which the width of the mesa structure enlarges gradually toward the emission facet is contained in the spot size converter section.

5. The semiconductor optical element according to claim 2, wherein a part in which the width of the mesa structure enlarges gradually toward the emission facet is contained in the straight propagating section.

6. The semiconductor optical element according to claim 1, wherein the width of the active layer in the straight propagating section is uniform and a thickness of the active layer at the emission facet in the spot converter unit is thinner than a thickness of the active layer in the straight propagating section.

7. The semiconductor optical element according to claim 6, wherein in the spot size converter section, the width of the mesa structure enlarges stepwise toward the emission facet.

8. The semiconductor optical element according to claim 6, wherein a part in which the width of the mesa structure enlarges gradually toward the emission facet is contained in the spot size converter section.

9. The semiconductor optical element according to claim 6, wherein a part in which the width of the mesa structure enlarges gradually toward the emission facet is contained in the straight propagating section.

10. The semiconductor optical element according to claim 1, wherein refractive index of the active layer in the straight propagating section is uniform and refractive index of the active layer in the spot size converter section is lower than refractive index of the active layer in the straight propagating section.

11. The semiconductor optical element according to claim 10, wherein in the spot size converter section, the width of the mesa structure enlarges stepwise toward the emission facet.

12. The semiconductor optical element according to claim 10, wherein a part in which the width of the mesa structure enlarges gradually toward the emission facet is contained in the spot size converter section.

13. The semiconductor optical element according to claim 10, wherein a part in which the width of the mesa structure enlarges gradually toward the emission facet is contained in the straight propagating section.

14. The semiconductor optical element according to claim 1, wherein in the spot size converter section, the width of the mesa structure enlarges stepwise toward the emission facet.

15. The semiconductor optical element according to claim 1, wherein a part in which the width of the mesa structure enlarges gradually toward the emission facet is contained in the spot size converter section.

16. The semiconductor optical element according to claim 1, wherein a part in which the width of the mesa structure enlarges gradually toward the emission facet is contained in the straight propagating section.

\* \* \* \* \*